US009778068B2

(12) United States Patent
Duncan et al.

(10) Patent No.: US 9,778,068 B2
(45) Date of Patent: Oct. 3, 2017

(54) SYSTEMS AND METHODS FOR CONDITIONING AND CONTROLLING POWER USAGE

(75) Inventors: Scott C. Duncan, West Jordan, UT (US); Joseph G. Stout, San Jose, CA (US); Frederick W. Goff, Austin, TX (US); Wayne R. Viehweg, Sandy, UT (US); Peter E. Fuller, West Jordan, UT (US); Collin S. Duncan, West Jordan, UT (US); Jacob B. Duncan, West Jordan, UT (US); Warren P. Willes, Alpine, UT (US)

(73) Assignee: Simplure, LLC, Sandy, UT (US)

( * ) Notice: Subject to any disclaimer, the term of this patent is extended or adjusted under 35 U.S.C. 154(b) by 116 days.

(21) Appl. No.: 13/058,983

(22) PCT Filed: Aug. 13, 2009

(86) PCT No.: PCT/US2009/004641
§ 371 (c)(1),
(2), (4) Date: May 3, 2011

(87) PCT Pub. No.: WO2010/019248
PCT Pub. Date: Feb. 18, 2010

(65) Prior Publication Data
US 2011/0208371 A1 Aug. 25, 2011

Related U.S. Application Data

(60) Provisional application No. 61/088,922, filed on Aug. 14, 2008.

(51) Int. Cl.
*G05D 3/12* (2006.01)
*G01D 4/00* (2006.01)
*G01R 19/25* (2006.01)

(52) U.S. Cl.
CPC ......... *G01D 4/002* (2013.01); *G01R 19/2513* (2013.01); *Y02B 90/241* (2013.01);
(Continued)

(58) Field of Classification Search
CPC ....... G01D 4/002; Y04S 20/32; Y04S 20/327; Y02B 90/241; Y02B 90/244; G01R 19/2513
(Continued)

(56) References Cited

U.S. PATENT DOCUMENTS 4,356,440 A 10/1982 Curtiss et al.
4,417,194 A 11/1983 Curtiss et al.
(Continued)

FOREIGN PATENT DOCUMENTS

WO WO 2010/019248 2/2010

OTHER PUBLICATIONS

Ackerman, Pamela; Power Factor Corerection for Power Systems; 2007; Department of Electrical and Computer Engineering COlorado State University; pp. 1-16.*
(Continued)

*Primary Examiner* — Kenneth M Lo
*Assistant Examiner* — Chad Rapp
(74) *Attorney, Agent, or Firm* — TraskBritt, P.C.

(57) ABSTRACT

Poorly matched electrical power systems (e.g., those with a poor power factor and crosstalk interference) that create a high transient demand for power result in unnecessarily high power bills. High transient demand for power may be decreased, and power bills thereby reduced, by placing an energy storage element near the entity's power input, thereby reducing crosstalk. The energy storage element may comprise a plurality of de-tuned capacitors. A reactive element may be placed in series with the energy storage element to repress high-frequency harmonics and to reduce
(Continued)

electrical noise. The energy storage element and/or the reactive element may be configurable. A control module may reconfigure the system responsive to measurements obtained at the entity and/or user commands received over a network or at the module itself.

23 Claims, 9 Drawing Sheets

(52) U.S. Cl.
CPC .............. *Y02B 90/244* (2013.01); *Y04S 20/32* (2013.01); *Y04S 20/327* (2013.01)

(58) Field of Classification Search
USPC .................. 700/22, 286, 293, 297, 296, 299
See application file for complete search history.

(56) References Cited

U.S. PATENT DOCUMENTS

| | | | |
|---|---|---|---|
| 4,517,512 A * | 5/1985 | Petrich et al. ................ 714/724 |
| 4,546,303 A | 10/1985 | Maeda et al. |
| 4,672,298 A | 6/1987 | Rohatyn |
| 4,769,587 A | 9/1988 | Pettigrew |
| 5,099,190 A | 3/1992 | Sato |
| 5,231,347 A | 7/1993 | Voisine et al. |
| 5,399,955 A | 3/1995 | Glaser et al. |
| 5,790,395 A | 8/1998 | Hagen |
| 6,377,037 B1 | 4/2002 | Burns et al. |
| 6,404,075 B1 | 6/2002 | Potter et al. |
| 6,496,342 B1 | 12/2002 | Horvath et al. |
| 6,516,326 B1 | 2/2003 | Goodrich et al. |
| 6,618,647 B1 | 9/2003 | Yamauchi |
| 6,756,771 B1 | 6/2004 | Ball et al. |
| 6,879,059 B2 * | 4/2005 | Sleva ............................... 307/38 |
| 6,900,556 B2 * | 5/2005 | Provanzana et al. ........... 307/19 |
| 6,980,890 B1 | 12/2005 | Cassara' et al. |
| 7,050,916 B2 | 5/2006 | Curtis et al. |
| 7,052,967 B2 | 5/2006 | Lee et al. |
| 7,085,824 B2 | 8/2006 | Forth et al. |
| 7,142,997 B1 | 11/2006 | Widner |
| 7,248,978 B2 | 7/2007 | Ransom |
| 7,315,790 B2 * | 1/2008 | Kindseth et al. ............... 702/64 |
| 7,358,706 B2 | 4/2008 | Lys |
| 7,369,950 B2 | 5/2008 | Wall et al. |
| 7,409,303 B2 | 8/2008 | Yeo et al. |
| 7,555,365 B2 | 6/2009 | Bhakta |
| 7,558,703 B2 | 7/2009 | Stoupis et al. |
| 8,120,932 B2 * | 2/2012 | Folts et al. ...................... 363/37 |
| 2001/0056330 A1 | 12/2001 | Wills |
| 2005/0105229 A1 | 5/2005 | Deng et al. |
| 2006/0072271 A1 | 4/2006 | Jones et al. |
| 2007/0008662 A1 * | 1/2007 | Bhakta .............................. 361/3 |

OTHER PUBLICATIONS

International Search Report PCT/US2009/004641 dated Apr. 5, 2010.

Wu, et al.; Power converter based method for suppressing Power capacitor harmonic current; IEE Proc.=Gener. Transm. Distrib., vol. 151, No. May 3, 2004.

Locci, et al.; Abstract; Detrimental Effects of Capacitors in Distribution Networks I the Presence of Harmonic Pollution, published in IEEE Transactions on Power Delivery, Issue 1, pp. 311-315, Jan. 2007.

International Preliminary Report on Patentability; PCT/US2009/004641 dated Feb. 24, 2011.

* cited by examiner

SYSTEMS AND METHODS FOR
CONDITIONING AND CONTROLLING
POWER USAGE

RELATED APPLICATIONS

This application claims the benefit under 35 U.S.C. §119
(e) of and priority to U.S. Provisional Patent Application
61/088,922, entitled "SYSTEMS AND METHODS FOR
CONDITIONING AND CONTROLLING POWER
USAGE", filed on Aug. 14, 2008, and which is hereby
incorporated by reference in its entirety.

TECHNICAL FIELD

This disclosure relates to systems and methods for providing power savings, and in particular, to systems and methods for reducing the power demands of an entity and reducing losses within the entity due to electrical noise within the entity.

SUMMARY

Poorly matched electrical power systems (e.g., those with a poor power factor and crosstalk interference) that create a high transient demand for power result in unnecessarily high power bills. High transient demand for power may be decreased and power bills thereby reduced, by placing an energy storage element near the entity's power input, thereby reducing crosstalk. The energy storage element may comprise a plurality of de-tuned capacitors. A reactive element may be placed in series with the energy storage element to repress high-frequency harmonics and to reduce electrical noise. The energy storage element and/or the reactive element may be configurable. A control module may reconfigure the system responsive to measurements obtained at the entity and/or user commands received over a network or at the module itself.

DETAILED DESCRIPTION OF PREFERRED
EMBODIMENTS

Electrical energy costs are a significant expenditure for many homes and businesses. This is increasingly true as energy costs rise. As such, there have been significant efforts made to reduce energy costs by decreasing the amount of energy used by the entities (e.g., replacing inefficient systems with more energy efficient systems, improving insulation, and the like). Similarly, cost savings may be realized by increasing the entities' power use efficiency.

The ratio of power transferred from a power source, such as a municipal power system (e.g., power grid or the like) and a power receiver may be expressed as a power factor. In a purely resistive AC circuit, voltage and current waveforms may be in step (or in phase), changing polarity at the same instant in each cycle. Where reactive loads are present, (e.g., capacitors, inductors, or the like) energy storage in the load may result in a time difference between the current and voltage waveforms. This stored energy returns to the source and is not available to do work at the load. Thus, a circuit with a low power factor will have higher currents to transfer a given quantity of real power than a circuit with a high power factor.

Therefore, the power factor of a particular entity may be expressed as follows:

$$P_F = \frac{P_R}{P_A} \qquad \text{Eq. 1}$$

In Equation 1, $P_F$ is the power factor, $P_R$ is the real power transmitted by the power source, and $P_A$ is the apparent power consumed by the entity. Typically, power is transferred over an AC signal, comprising a sinusoidal signal (voltage and current signals approximately 90° out of phase). In this case, the power factor may be expressed as vectors forming a vector triangle, such that:

$$P_A = P_R^2 + Q^2 \qquad \text{Eq. 2}$$

In Equation 2, Q represents the reactive power of the entity. As such, the apparent power ($P_A$) can be determined from a sum of the square of the real power ($P_R$) and reactive power (Q). According to the vector sum of Equation 2, if $\delta$ is the phase angle between the current and voltage signals, the power factor ($P_F$) may be expressed as a cosine of the of angle difference:

$$P_F = S|\cos(\delta)| \qquad \text{Eq. 3}$$

When the power factor is zero (0), the energy flow is completely reactive, and stored energy in the load (e.g., the entity) returns to the source on each cycle. If the power factor is optimal (e.g., one), all of the energy supplied by the source is consumed by the load.

Figure 1:
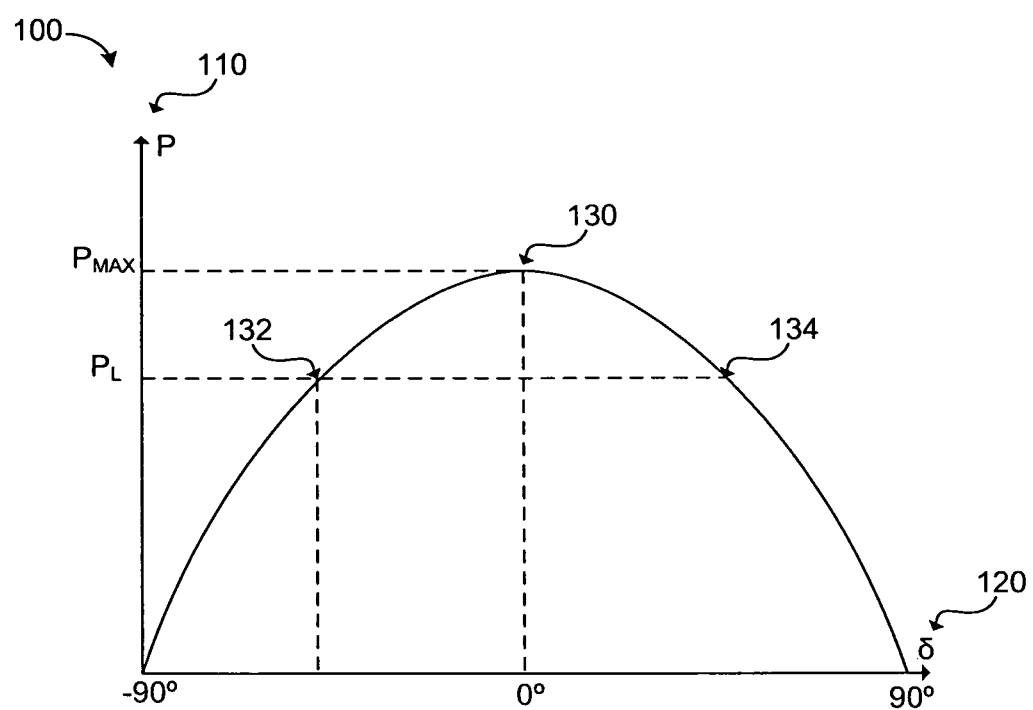
FIG. 1 is a power transfer plot.

FIG. 1 depicts one embodiment of a power angle curve 100 of Equation 1. The power angle curve 100 shows the effect on power angle $\delta$ (axis 120) on the power transferred (axis 110) between a sending source and receiving source. In the FIG. 100 embodiment, an optimal power transfer $P_{MAX}$ 130 is achieved when Equation 3 is satisfied (e.g., the phase angle offset between the current and voltage signals is 0° so the cos is one (1)). This point is shown on the plot as point 130. Divergence from alignment results in reduced power transfer and efficiency. For example, a leading power factor results from a current signal leading the voltage signal (e.g., point 132), and a lagging power factor results from a current signal lagging the voltage signal (e.g., point 134). In both cases (132 and 134), the power factor is reduced, resulting in reduced power transfer efficiency ($P_L$).

Poor power factor performance (e.g., power angle $\delta$ divergence) may be exacerbated due to temporary conditions within the entity. For example, electrical components within the entity may create power system noise and/or transient inrush conditions, such components may include, but are not limited to: electrical motors, transformers, ballasts, power supplies, VFDs, soft starts, Insulated Gate Bipolar Transistors (IGBT), capacitors distributed throughout the system and the like. This noise and/or transient current inrush conditions created by these components may cause further divergence phase angle difference δ between the power grid and the entity.

In addition, power company billing policies may penalize the entity for its instantaneous power requirements, often referred to as "demand." For instance, many power companies charge entities a rate or penalty based on a maximum demand created by the entity over a pre-determined time period. The assessed demand level may be the maximum power required by the entity over a pre-determined time period (e.g., fifteen minutes) over the course of a particular billing period. As such, if an entity draws an inordinate amount of power at particular times (e.g., during machine startup or the like), the demand power requirement of the entity (and subsequent charge levied by the power provider) may be very significant.

Figure 2A:
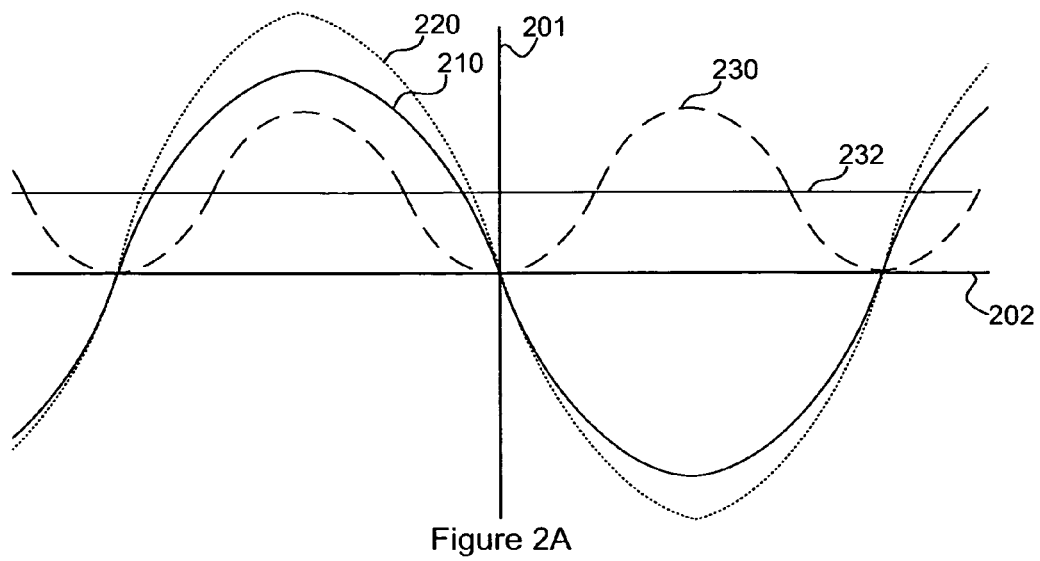
FIG. 2 is a plot of a voltage and current signal.

FIG. 2A is a plot comprising an aligned voltage and current signal. Under balanced conditions (e.g., a condition having a power factor of substantially one (1)), a voltage signal 210 may be offset from the current signal 220 by substantially 0°. The power transfer 230 may peak as the voltage signal 210 and current signal 220 peak, and go to zero as the voltage signal 210 and current signal 220 go to zero. Due to the alignment of the voltage signal 210 and current signal 220, the power factor (not shown) may be substantially one (1), and the average power transfer 232 may be at an optimal level.

Figure 2B:
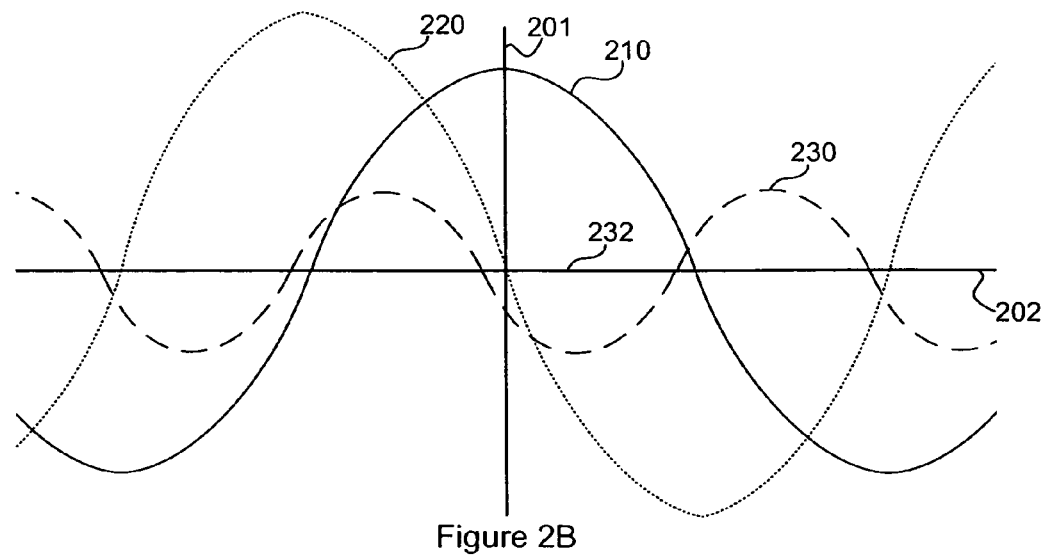

However, where there is divergence between the phase of the voltage signal 210 and the current signal 220, power transfer may be reduced. FIG. 2B shows a voltage signal 210 and current signal 220 at 90° out of phase. The power transfer 230 may be reduced. In fact, since the voltage signal 210 and current signal 220 are 90° out of phase, the power factor is substantially zero (0). Therefore, the average power transferred 232 may be substantially zero (0).

As discussed previously herein, current lead and/or lag conditions (e.g., conditions where the current signal either leads or lags the voltage signal) may cause inefficient power transfer (e.g., a reduced power factor). Because of this inefficient power transfer, the instantaneous power demands of the business may increase (e.g., the entity may require increased power from the power source to perform the same amount of work). This is because in an out-of-phase condition the entity must draw more power from the source to satisfy its power requirements.

The power supplier may track users' power efficiency using a "power factor" metric between zero and one (1). In some markets, entities having a low power factor may be penalized with a penalty rate. In fact, the power supplier may display the power factor measured on the entity's bill for penalty assessment purposes. As discussed previously herein, the power factor is directly related to the demand required by the entity. For example, if the entity's power requirement is $P_{Req}$, and has a power factor $P_F$, the actual power demand (D) observed by the power provider may be higher:

$$D = \frac{P_{Req}}{P_F} \qquad \text{Eq. 4}$$

Since the power factor (PF) ranges from zero to one (1), the observed demand D will generally be higher than the power required by the entity ($P_{Req}$). The amount of demand that the entity may save by improving the power factor may be shown in Equation 5:

$$D_{New} = \frac{D \cdot P_F}{P_{New}} \qquad \text{Eq. 5}$$

In Equation 5, the new demand $D_{New}$ achieved by improving the power factor to $P_{New}$ may be determined dividing the product of the original demand D and the original power factor ($P_F$) by the new power factor $P_{New}$. For example, a demand of 1000 kW at a power factor of 0.7 ($P_F$), could be reduced to 736 kW by improving the power factor to 0.95 ($P_{New}$).

Several approaches have been suggested to address both power factor correction and reduction of observed peak demand. In one approach, capacitive elements are placed in parallel and in close proximity with components likely to create large, transient current inrush conditions (e.g., electrical motors or the like).

Figure 3:
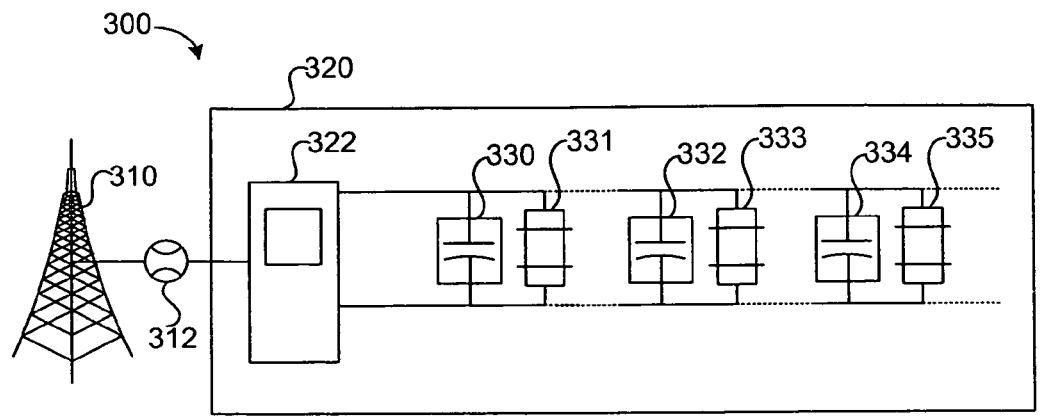
FIG. 3 is a block diagram of an electrical power system.

FIG. 3 is a block diagram of one embodiment of such a prior art system. In the system 300, the capacitors 330, 332, and 334 may be placed in parallel with electrical components in electrical proximity to the component's starter system, safety device, or the like. The electrical components 331, 333, and 335 may be any electrical components likely to produce large, transient current inrush conditions As such, the components 331, 333, and/or 335 may comprise motors, transformers, or the like.

Power may be provided to an AC circuit 320 from a power grid 310. The AC circuit 320 is owned by an entity. The power grid 310 may comprise a power provider meter 312 to monitor the power consumed by the AC circuit 320, the power factor of the AC circuit 320, a peak demand created by the AC circuit 320, and the like. The power provider meter 312 may be capable of measuring a power angle difference δ between the power provided by the grid 310 and the power consumed by the AC circuit 320. As discussed previously herein, this difference may be embodied as a power factor metric.

The AC circuit 320 comprises a power receiver 322, which may comprise an electrical input panel or the like capable of interfacing with the power grid 310. The panel 322 distributes power to the electrical components 331, 333, and 335 (transformer.)

As discussed previously herein, the electrical components 331, 333, and/or 335 may create transient current inrush conditions (e.g., at startup or the like). The inrush conditions may degrade the power factor, which, as discussed previously herein, may increase the penalty paid by the entity to the power provider (not shown). In addition, the degradation of the power factor may exacerbate the peak demand assessed by the power provider (not shown), further increasing the power costs of the entity. The load on the transformer also affects the power factor as well as the transformer performance. Transformers are more efficient under load.

The capacitors 330, 332, and 334 wired in parallel with the individual electrical components 331, 333, and 335 may be used to improve the power factor of the AC circuit 320 and reduce the entity's peak power demand. During normal operations, the capacitors 330, 332, and 334 will charge and release correcting the power factor phase angle, creating an energy reserve in parallel with each of the respective electrical components 331, 333, and 335. Accordingly, transient current inrush requirements of the respective electrical components 331, 333, and 335 may be supplied by the respective capacitors 330, 332, and 334 (e.g., supplied by the power stored in the parallel capacitors 330, 332, and 334).

However, this approach may create undesirable side effects. For instance, the distributed capacitors 330, 332, and 334 may magnify harmonics and create cross-talk therebetween. The cross talk between the capacitors 330, 332, and 334 may cause energy loss within the AC circuit 320. In addition, the harmonics and other noise created by the capacitors may create an environment in which it is difficult or impossible to diagnose electrical anomalies in the AC circuit 320 (e.g., because such conditions may be masked by the noise and/or harmonics created and magnified by the capacitors 330, 332, and 334). As such, although the distributed capacitors 330, 332, and/or 334 may improve the power factor of the AC circuit 320, the overall power consumption of the AC circuit 320 may remain high.

Figure 4:
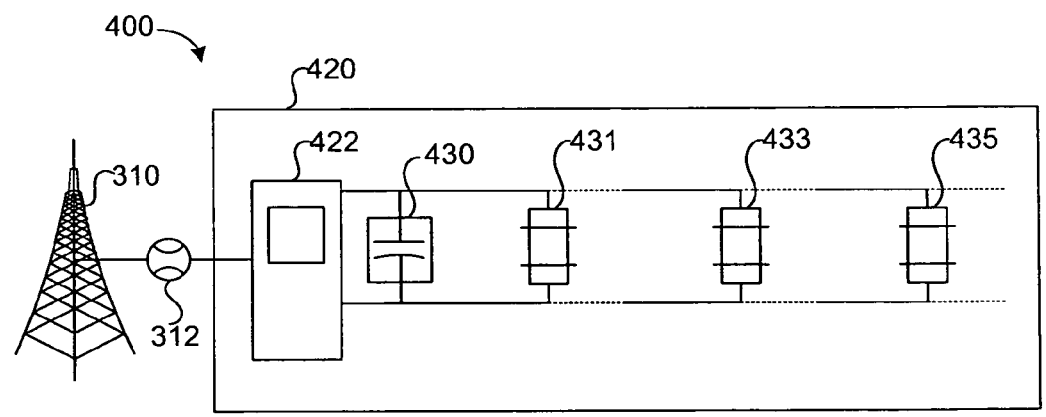
FIG. 4 is a block diagram of an electrical power system comprising an energy storage element.

FIG. 4 is a block diagram of one embodiment of a system 400 for improving power factor and/or reducing peak demand for an AC circuit 420.

In the FIG. 4 embodiment, the energy storage requirements of the AC circuit 420 may be supplied by a single energy storage module 430. The energy storage element 430 may comprise any energy storage component(s) known in the art including, but not limited to, one or more capacitors, one or more inductive components (e.g., iron core inductors or the like), one or more super capacitors, batteries, a solar power source, a wind power source, fuel cell(s), a generator, one or more chokes, one or more reconfigured transformers, or any other device capable of satisfying the transient power requirements of electrical components 431, 433, and/or 435 of the AC circuit 420.

The placement of the energy storage element 430 proximate to the panel 422 may assure that the voltage and current levels measured by the power provider meter 312 of the power provider (not shown) remain at a constant level. "Proximate" or "near", as used in this regard means, as close as physically possible given the routing space, wall or floor space available and/or size of the existing or customary distribution panels (e.g., <20 meters). A trade-off exists between distance and size of wire to make the connection. At some distance away, the wire size becomes unreasonably large to perform the function. Also, the placement will preferably be either "near" a utility meter, or the line side of any internal transformer, at a distribution panel. As such, the AC circuit 420 is less likely to create swings in power demand, which, as discussed previously herein, may cause the power provider (not shown) to penalize the AC circuit 420. Moreover, since a single, consolidated energy storage element 430 is deployed, harmonics or cross-talk between sparsely deployed energy storage elements (e.g., capacitors) is avoided.

In embodiments where the energy storage element 430 does comprise a plurality of capacitors, the capacitors may be de-turned. The de-tuning may prevent harmonics and/or cross-talk between the plurality of capacitors comprising the energy storage element 430. In one embodiment, de-tuning the energy storage element 430 may further comprise selecting different capacitor configurations, such as capacitors having different capacities, capacitors supplied by different vendors, and/or capacitors of varying type.

Figure 5:
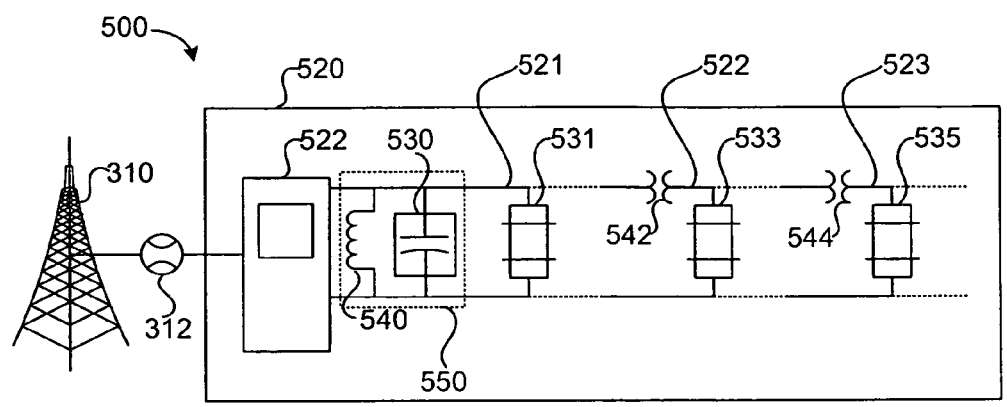
FIG. 5 is a block diagram of an one embodiment of an electrical power system.

FIG. 5 is a block diagram of another embodiment 500 of a system for improving power efficiency of an AC circuit 520. The FIG. 5 embodiment depicts reactive elements 542 and 544 that may exist in the AC circuit 520. The reactive elements 542 and/or 544 may correspond to transformers (K rated or otherwise), motor coils, or other elements found in electrical systems.

The reactive elements 542 and 544 may serve to reduce harmonics and other noise within the AC circuit 520. Transient disturbances, high speed switching power supplies, insulated gate bi-polar transistors (IGBT) in variable frequency drives and soft starts and such as inrush current conditions discussed previously herein, may create harmonics. In addition, the energy storage element 530 may also magnify harmonics in the system as it compensates for inrush and inductive load conditions created by electrical components 531, 533, 535, and the like.

One or more meters 521, 522, and 523 may be placed in electrical communication with the AC circuit 520. The meters 521, 522, and 523 may be capable of reading phase voltage and/or phase current signals at their respective locations within the AC circuit 520. As such, the meters 521, 522, and 523 may detect current lag and/or lead conditions as well as harmonic transient conditions within the AC circuit 520.

Responsive to these measurements, a switchable storage element 550 may be configured for the AC circuit 520. The switchable storage element 550 may comprise an energy storage element 530 and a reactive element 540. The energy storage element 530 may be sized according to the transient energy requirements of the AC circuit 520 and/or an observed power factor of the AC circuit 520 (e.g., as reported by the power provider (not shown), measured by the power provider's metering systems 312, and/or measured by the meters 521, 522, and 523).

As discussed previously herein, the energy storage element 530 may comprise one or more capacitive elements. The capacitive elements of the energy storage element 530 may be de-turned to prevent harmonics and/or cross-talk between the elements. De-tuning may comprise selecting capacitors from different vendors, capacitors having different capacities, and/or capacitors of differing type.

The switchable storage element 550 may further comprise a reactive element 540 in serial and/or in parallel with the energy storage element 530. As discussed previously herein, the reactive element 540 may be used to reduce harmonic and other disturbances within the AC circuit 520. The reactive element may comprise an iron core inductive element to dampen high-frequency harmonics within the AC circuit 520. The reactive element 540 may be sized according to measurements obtained by the meters 521, 522, and/or 523. As such, the sizing of the reactive element 540 and the energy storage element 530 may be configured, such that the power factor of the AC circuit 520 is optimized (e.g., substantially one (1)), and/or the voltage signal and current signal remain at substantially 90° phase angle offset (see FIG. 2B). The switchable storage element 550 may include the capability of turning on or off reactive capacitance or inductive loads, or any combination thereof, prior to equipment start/stop. This may be indicated by a remote signal provided by a circuit or device interconnected with the start/stop control of any machine or device system wide. This circuit or device may include a delay for the normal start/stop events, allowing reactance to be initiated and stabilized prior to energizing the load, thereby enhancing real time performance and limiting leading or lagging current conditions. The circuit will not affect emergency stop conditions. This performance system (delay circuit or device and reactance alterations) can be monitored and initiated by an onboard or embedded control module (652A or the like), e.g., with remote Internet monitoring.

After configuring the switchable storage element 550, the one or more meters 521, 522, and 523 may be removed.

As shown in FIG. 5, the power switchable storage element 550 is disposed proximate to the power panel 522 and the power provider meter 312. This may allow the switchable storage element 550 to maintain the voltage and current performance level and balance at the power provider meter 312 to an appropriate level. This may prevent the power provider meter 312 from registering dips in power level indicating a reduced power factor and/or increased demand, which, as discussed previously herein, may cause the power provider (not shown) to penalize the entity.

Figure 6A:
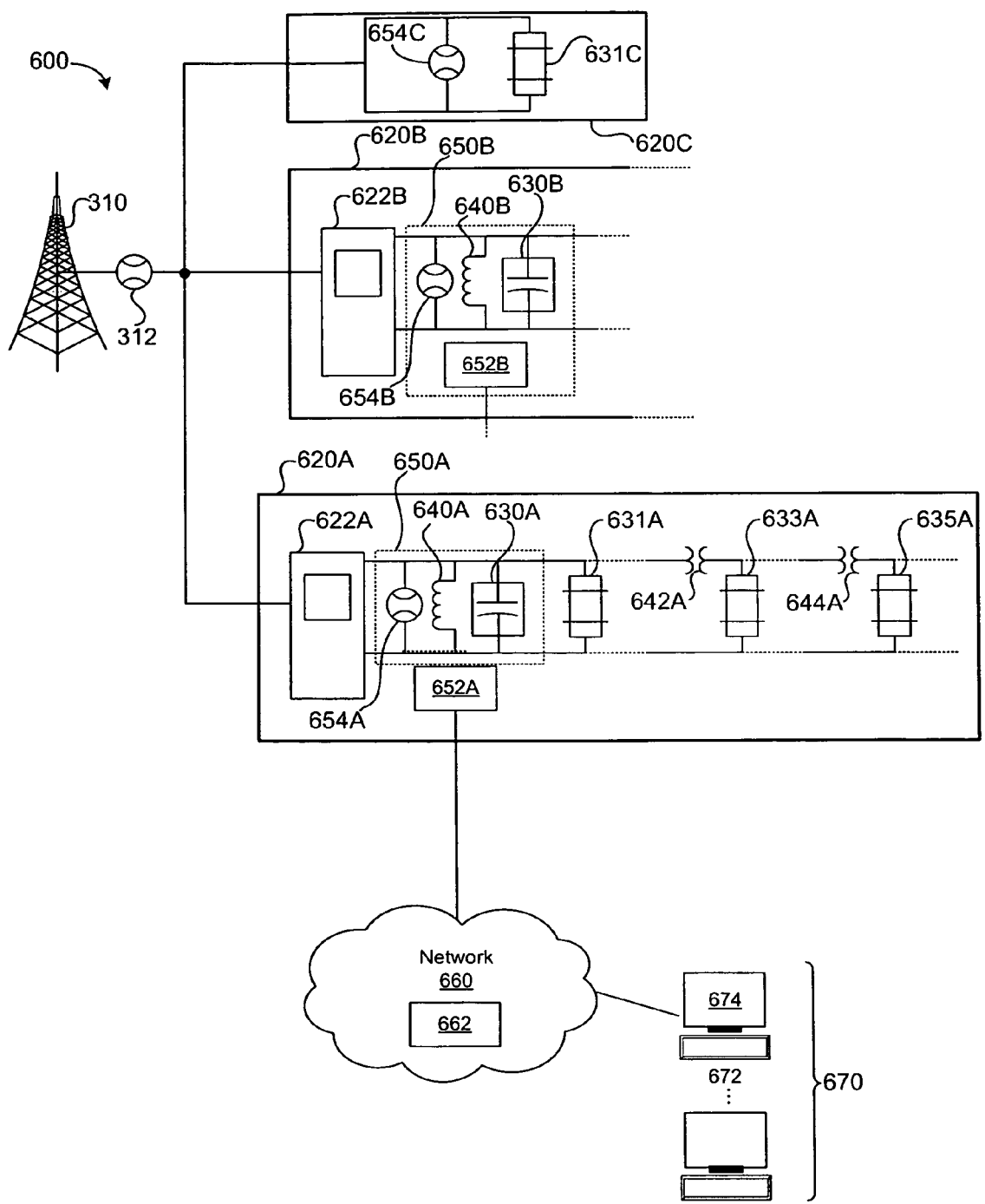
FIG. 6A is a block diagram of another embodiment of an electrical power system.
Figure 6B:
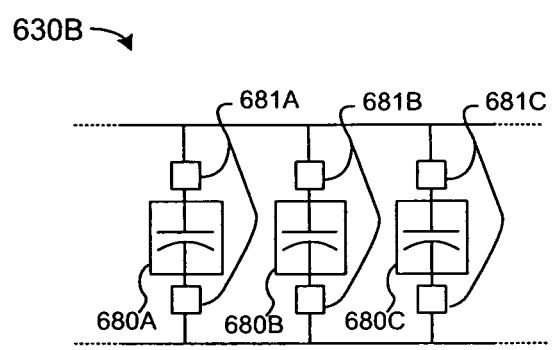
FIG. 6B is a block diagram of one embodiment of a switchable storage element.
Figure 6C:
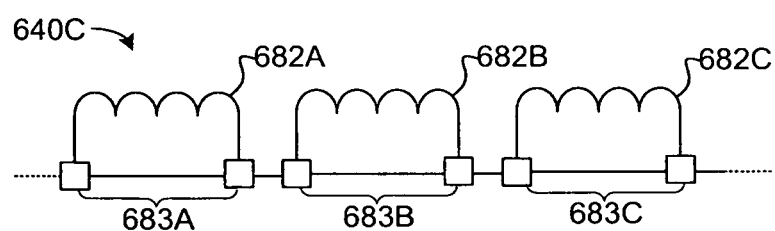
FIG. 6C is a block diagram of one embodiment of a switchable reactive storage element.

FIGS. 6A to 6C depict a presently preferred embodiment of the invention. FIG. 6A is a block diagram of a system comprising a switchable storage element 650. In the FIG. 6A embodiment, the switchable storage element 650A may comprise an energy storage element 630A and a reactive element 640A configured substantially as described above (e.g., by metering the AC circuit 620A at various points). In addition, the switchable storage element 650A may comprise a meter 654A to obtain voltage measurements, current measurements, and other measurements at AC circuit 620A. The voltage measurement, current measurements, and other measurements are a power quality of the AC circuit 620A. The power quality can be a harmonic, a power factor, a phase, a current, a voltage, an impedance, a reactance, an active power, an apparent power, a peak power, a reactive power, phase load, a phase load balance, a phase balance, and the like.

The AC circuit 620A may comprise a control module 652A. The control module 652A may be communicatively coupled to the meter 654A and a network 660. The network 660 may comprise any communications network known in the art including, but not limited to: a public switched telephone network (PSTN); a local area network (LAN); a wide area network (WAN); a virtual private network (VPN); a wireless network (e.g., IEEE 802.11 series network, a Bluetooth® network, or the like); the Internet; a combination of the above; or the like. Accordingly, the control module 652A may comprise a communications interface (not shown) adapted to interface with the network 660.

The control module 652A may be communicatively connected to one or more users 670 via the network 660. Each of the users 670 may be connected to the network via a respective computing device 672, which may comprise any computing device known in the art including, but not limited to: a personal computing device comprising an input interface, a display interface, and the like; a personal digital assistant (PDA); a smart phone; a cellular telephone; a portable computing device; or the like. The respective computing devices 672 may comprise an application 674 configured to communicate with the control module 652A, such as web browser software, a custom application, or the like.

In some embodiments, the control module 652A may be communicatively connected to the one or more users 670 via a server 662. The server 662 may receive information from a plurality of other control modules 652 aggregate the information, and provide the information to the users 670. In addition, the user can directly interface with the control module 652.

In some embodiments, the control module 652A (or the server 662 communicatively connected to the control module 652A) may be configured to present an interface to the users 670 according to the Hyper Text Transfer Protocol (HTTP) or a related standard. In such embodiments, the application 674 may comprise web browser software, such as Microsoft Internet Explorer®, Mozilla Firefox®, or the like. Alternatively, or in addition, the control module 652A may provide a text-based interface. Accordingly, the application 674 may comprise a Telnet application or other console-based application. In some embodiments, the control module 652A may produce content according to a pre-determined data specification, such as eXtensible Markup Language (XML) or the like. In this case, the application 674 may comprise web browser software and/or a custom application configured to parse and present the data produced by the control module 652A.

The users 670 may submit data and/or control commands to the control module 652A over the network 660 using the respective computing devices 672. As such, the control module 652A may comprise security measures, such as authentication systems or the like, to prevent unauthorized access to the data generated by the control module 652A and/or to prevent unauthorized data submissions to the control module 652A. Examples of such authentication systems include, but are not limited to: biometric authentication; password-based authentication; a personal identification number (PIN); public key infrastructure (PKI) authentication; or the like. The authentication systems (not shown) may be disposed on the control module 652A and/or on the respective computing devices 670.

In some embodiments, data transmitted to and from the control module 652A may be secured (e.g., encrypted) to prevent unauthorized access to the data and/or data tampering.

The user can send commands to the control module 652A. The commands can be to switch on and/or off the switchable storage element 650A prior to an event. An event can be at a changing of a shift in a factory, a holiday, a calendar event, a specific time, maintenance period, a plant closing, and the like. This allows the control module 652A to switch off the switchable storage element 650A when the AC circuit 620A is not in use. Turning off the switchable storage element 650A can increase the life of the switchable storage element 650A The control module 652A may be configured to transmit power quality data obtained from the meter 654A. The power quality data may comprise voltage signal measurements and current signal measurements. The control module 652A can determine a trend of measured data over time. These measurements may be used to determine a power factor of the AC circuit 620A and/or determine whether a current lag and/or current lead condition exists over time. In addition, the metering may indicate the nature of harmonics or other disturbances present in the AC circuit 620A. The control module 652A can turn on and off elements (640A and 630A) of the switchable storage element 650A based on the trend of the measured power quality over time.

The control module 652A may transmit the power quality data and/or trends to notify the users 670 (e.g., to the respective computing devices 672 of the users 670) via the network 660. The application 674 on each of the computing devices may present the power quality data to the users 670.

The power quality data may allow the users 670 to identify potential problems at the AC circuit 620A. As discussed previously herein, the switchable storage element 650A may comprise an energy storage element 630A and a reactive element 640A. The sizing of the energy storage element 630A and/or the reactive element 640A may be determined based upon power quality measurements obtained at the entity (e.g., by meters 521, 522, and 523 of FIG. 5). However, the electrical requirements of the AC circuit 620A may change over time. This may be due to the addition and/or removal of electrical components, such as electrical components 631A, 633A, and/or 635A. In addition, changes to the electrical demand of the AC circuit 620A may result from damage and/or wear on the electrical components 631A, 633A, and/or 635A. For example, a motor that has "burnt out" may draw significantly more current than a properly operating motor.

In some embodiments, control module 652A may be communicatively coupled to one or more sensors (not shown) disposed within the AC circuit 620A. The sensors may be capable of obtaining current and/or voltage measurements at various points within the AC circuit. The sensors (not shown) may indicate when a particular electrical component (e.g., electrical component 631A) starts up, shuts down, and the like. This may allow the control module 652A to correlate power quality data obtained from the meter 654A to the operation of a particular component (e.g., electrical component 631A), and/or may allow the control module 652A to reconfigure (e.g., turn on and off) the energy storage element 630A and/or reactive element 640A responsive to sensor measurements associated with one or more electrical components (631A, 633A, 635A, 643A, and/or 644A).

In some embodiments, the control module 652A may be configured to identify one or more components within the AC circuit 620A (e.g., electrical components 631A, 633A, 635A, 642A, and/or 644A) based on a power usage profile of the particular device. As discussed previously herein, the control module 652A may be communicatively coupled to a meter 654A. Each electrical component in the AC circuit (631A, 633A, 635A, 642A, and/or 644A) may have a distinguishable power usage pattern that is measurable by the meter 654A. For example, a motor component 631A may create a distinguishable power usage trend at startup time. The control module 652A may be capable of identifying a particular power usage trend and associating the trend with a particular device. As such, the control module 652A may be configured to detect changes in the power usage trends of particular electrical components 631A, 633A, 635A, 642A, and/or 644A. Such changes may be indicative of a problem with the device (e.g., an increase in power usage may indicate that a motor is burning out). Accordingly, the command module 652A may be configured to notify the one or more users 670 of the detected condition.

As discussed previously herein, the control module 652A may be communicatively coupled to one or more sensors (not shown) distributed throughout the AC circuit 620A. The sensors (not shown) may be coupled to one or more of the electrical components 631A, 633A, 635A, 642A, and/or 644 within the AC circuit 620A. As such, the control module 652A may be capable of monitoring individual devices using the sensors (not shown). Similarly, the control module 652A may be configured to correlate power quality data obtained from the meter 654A using the sensors (not shown). A sensor (not shown), may detect characteristics of electrical components such as temperature, power status, light, smoke, water, vibration, nearby movement, or machine speed. For example, a sensor (not shown) may be coupled to a motor component 631A and may indicate the control module 652A that the motor is starting up. The control module 652A may use the information received from the sensor (not shown) to associate the startup of the motor component 631A with measurements obtained by the meter 654A. This way, the control module 652A may turn on and off the element (640A and 630A) in the switchable storage element 650A. The control module 652A may provide users 670 with an indication of the power usage and/or transient power usage of each the electrical components 631A, 633A, 635A, 642A, and/or 644A. In addition, the control module 652A may be configured to detect faults in particular components (e.g., high power draws and the like) by correlating component usage (obtained by the sensors (not shown)) with readings obtained by the meter 654A to switch on and off elements (640A and 630A) of the switchable storage element 650A.

The data received from the metering and control module 652A may provide for detection of changing power quality occurring within the AC circuit 620A to allow entity to address the changes. In some embodiments, the control module 652A may comprise a computing device (not shown) capable of automatically detecting abnormal operating conditions at the AC circuit 620A, such as poor power factor, current lead, current lag, harmonics, or the like. As discussed previously herein, the detection may comprise detecting issues within the AC circuit 620A and/or issues related to particular electrical components 631A, 633A, 635A, 642A, and/or 644A within the AC circuit 620A. Upon detecting such a condition, the control module 652A may transmit a warning or other notification to one or more of the users 670. The warning or other notification may comprise a telephone message, a SMS text message, a fax, a .pdf, an email, or the like.

In some embodiments, the energy storage element 630A may be configurable. For example, the energy storage element 630A may be capable of dynamically changing its energy storage capacity. In embodiments where the energy storage element 630A comprises a plurality of capacitors, configuration of the energy storage element may comprise adding and/or removing one or more capacitors. Addition of capacitors increases the energy storage capacity of the module 630A, and removal of capacitors decreases the energy storage capacity of the module 630A. Similarly, the addition and removal of capacitors from the module 630A may affect the power factor correction provided by the AC circuit 620A, which as discussed previously herein, may affect current lag and/or current lead conditions.

As discussed previously herein, the control module 652A may be communicatively coupled to a server 662. The server 662 may be communicatively coupled to the user 670 and may allow the users 670 to interact with the control module 652A. In addition, the server 662 may be communicatively coupled to one or more other control modules (e.g., control module 652B). The meter 654B may correspond to other installations within a particular AC circuit and/or may correspond to separate and distinct AC circuits.

The embodiment of FIG. 6A shows two control modules, 652A and 652B. These two modules 652A and 652B may be deployed at different AC circuits 620A and 620B of a particular entity or a single control module 652 may be deployed for both AC circuits 620A and 620B. For instance, the entity may comprise multiple printing presses. The first AC circuit 620A may correspond to a first set of printing systems and the second AC circuit 620B may correspond to a second set of printing systems. The control modules 652A and 652B may each be communicatively connected to the network 660 and/or to a server 662. The connection may allow the control modules 652A and 652B to communicate with one another. Accordingly, the modules 652A and 652B may coordinate their respective operations.

For instance, as shown in FIG. 6A, the first AC circuit 620A and the second AC circuit 620B may be electrically connected to the electrical power source 310 over a commonly metered connection (e.g., metered by power provider meter 312). The startup of one or more components in the first AC circuit 620A (e.g., electrical components 631A, 633A, and/or 635A) simultaneously with one or more components (not shown) at the second AC circuit 620B may cause an increase in demand that the respective switchable storage elements 650A and 650B are unable to handle, causing an observable voltage drop at the power provider meter 312. As discussed previously herein, such a drop may cause the power provider 310 to penalize the entity. Accordingly, the control modules 652A and 652B (or a single control module 652) may be configured (e.g., via one or more computer readable and/or user 670 provided instructions) to coordinate component startup operations at the first AC circuit 620A and the second AC circuit 620B to prevent increased demand conditions.

Although not shown in FIG. 6A, other control modules (not shown) may be coupled to the users 670 via the network and/or server 662. These additional control modules (not shown) may correspond to additional locations of a particular entity and/or may comprise separate and AC circuits (not shown). In this way, one or more users 670 may monitor and/or configure a plurality of entities and/or locations within an entity, from a central location.

In some embodiments (as shown in FIG. 6B), addition and removal of capacitors may be performed by selectively connecting one or more capacitors within the energy storage element 630A. The selective connection may be done via a programmable logic controller (PLC), one or more switch elements, or the like.

Similarly, in some embodiments, the reactive element 640A may be configurable. For example, the reactive element 640A may be capable of dynamically changing the reactive (impedance) introduced into the AC circuit 620A. In some embodiments, this may be done by selectively coupling one or more reactive elements to the AC circuit 620A using a PLC, a switch, or the like. One embodiment of a configurable reactive element is described below in conjunction with FIG. 6C.

The control module 652A may be communicatively coupled to the energy storage element 630A and the reactive element 640A to control their respective configuration. Therefore, the control module 652A may be capable of adding and/or removing energy storage capacity from and/or tuning the reactance in the AC circuit 620. The control module 652A may make such configuration changes autonomously accordingly to programming of the module 652 and/or responsive to commands received from the users 670.

Accordingly, the control module 652A may comprise processing means, such as a PLC, ARM processor, or the like to interpret and perform such instructions. In addition, the control module 652A may comprise data storage means, such as memory, a fixed disc, a database, an embedded database, or the like capable of storing such instructions.

In some embodiments, the control module 652A may be further communicatively coupled to one or more systems of the entity, such as fire system (not shown), security systems (not shown), and the like. The control module 652A may reconfigure the switchable storage element 650A responsive to alarms or other notifications received from the respective systems. For instance, the control module 652A may be configured to disconnect and/or discharge the energy storage element 630A upon detection of a fire or other emergency within the entity.

As discussed previously herein, in some embodiments, the control module 652 may comprise a PLC or other processing means (e.g., a general purpose processor, such as an Intel® X86 series process, an X Scale processor, an ARM® processor, or the like). As discussed previously herein, the processing means (not shown) may comprise a memory or other data storage mechanism for storing programming data. The programming data may comprise instructions to cause the control module 652 to reconfigure the energy storage element 630 and/or reactive element 640 responsive to measurements obtained by the meter 654, sensor readings, user 670 instructions, and the like. For example, in response to detecting a poor power factor combined with current lag, the control module 652A may increase the number of active capacitors of the energy storage element 630A. Similarly, if a poor power factor coupled with current lead is detected, the control module 652A may be configured to decrease the active capacitors of the energy storage element 630A. Similarly, the control module may reconfigure the reactive element 640A responsive to power factor, harmonics, and other conditions detected by the meter 654A.

In addition, control module 652A may be configured to take scheduled actions responsive to periodic activity at the AC circuit 620A. For example, the AC circuit 620A may startup its equipment (e.g., electrical components 631A, 633A, and/or 635A) at certain times of the day. As discussed previously herein, component startup may create current inrush conditions at the AC circuit 620A. To handle this periodic inrush condition, the control module 652A may be configured to add capacity to the energy storage element 630A and/or reactance at the reactance element 640A at a pre-determined time period before the expected inrush condition (e.g., in order to allow any increased capacity in the energy storage element 630A to charge). Accordingly, the energy storage element 630A may be fully charged and ready to supply power when needed and the reactance element 640A may be capable of suppressing harmonics generated during the startup condition. After equipment startup, the control module 652A may reconfigure the energy storage element 630 and/or reactance element 640A back to nominal values. Accordingly, power lost to the energy storage element 630A and/or reactance element 640A may be minimized, and the system may be maintained at a desired power factor.

Similarly, as discussed previously herein, the control module 652A may reconfigure the switchable storage element 650A and/or control the operation of components (e.g., electrical components 631A, 633A, 635A, and so on) responsive to the operation of other AC circuits 660 at other locations (e.g., AC circuit 620A, 620B or 620C). For example, if the control module 652B of the second AC circuit 620B indicates that a number of its components will be starting up at a particular time, the control module 652A may adjust the start up time of one or more of its components (e.g., electrical components 631A, etc.) to avoid causing excessive demand levels.

Programming of the control module 652 (e.g., such as the startup scheduling programming discussed above), may be performed at the control module 652 itself. As such, the control module 652 may comprise an input interface and/or display interface. In some embodiments, the input interface may comprise a serial cable interface, such as a serial cable (e.g., RS-232 cable) or the like. Alternatively, or in addition, the control module 652 may comprise an input interface (not shown), such as a keyboard and mouse, an output interface (not shown), such as a display monitor, audio speakers, printer, and the like.

In addition, the control module 652 may receive programming from the users 670 via the network 660. The programming may comprise instructions in reconfiguring the energy storage element 630 and/or reconfiguring the reactance element 640. The programming and/or commands from the users 670 may be responsive to measurements transmitted to the users 670 by the control module 652 and/or may be responsive to scheduling or other pre-determined programming directives. For example, the AC circuit 620 may shut down for a significant period of time during certain holidays (e.g., Christmas). A user 670 may direct the control module 652 to deactivate the energy storage element 630 and/or reactive element 640 during such holidays. Similarly, other conditions, such as a change to the electrical components 631, 633, and/or 635 may prompt reconfiguration of the energy storage element 630 and/or reactive element 640 by a user 670.

As an example of how the above system can work consider the following example. The control module 652 gets a power quality (e.g., a power factor) of the AC circuit 620 by reading the meter 654 over a time period. The control module 652 determines a trend of the power factor over the time period. The control module 652 turns an element of the switchable storage element 650 on and off based on the trend in the power factor. For example, the control module may turn off the element (630 and/or 640) of the switchable storage element 650 based on a decrease in the power factor.

The control module 652 can also get a characteristic of an electrical component (e.g., 631A) and turn an element (630 and/or 640) based on the characteristic of the electrical component. This can be done in conjunction with the measured power quality. The control module 652 can get a characteristic of the switchable storage element 650 such as a temperature of the switchable storage element 650. The control module 652 can turn an element (630 and/or 640) on or off based on the characteristic. The control module 652A can also read the meter 654C and turn on or off an element (640A and/or 630A) based on the reading of meter 654C. Likewise, the control module 652A can read a characteristic of electrical component 631C and turn on or off an element (640A and/or 630A) based on the read characteristic of the electrical component 631C.

FIG. 6B is one embodiment of a switchable storage element 650. The switchable storage element 650 may comprise a plurality of capacitors 680A-680C in an electrically parallel configuration. As discussed previously herein, in some embodiments, the capacitors 680A-680C may be de-turned, such that the capacitors 680A-680C include capacitors of differing capacity, type, and/or vendor.

The capacitors 680A-680C may be selectively connected to the energy storage element 630B using respective switches 681A-681C. Disconnection of a capacitor 680A-680C may electrically remove the respective capacitor 680A-680C from the energy storage element 630B, and connection of a capacitor 680A-680C may place the respective capacitor 680A-680C in parallel with the other capacitors 680A-680C in the energy module 630B.

FIG. 6C is one embodiment of a configurable reactive version of a switchable storage element 650. The reactive version of a switchable storage element 650 may comprise a plurality of reactive components 682A-682C (e.g., iron core inductors) in an electrically serial configuration. A plurality of switches 683A-683C may selectively connect (or isolate) each of the reactive elements 682A-682C. Connection of a reactive element 682A-682C may place the element in serial with the other reactive elements 682A-682C in the reactive version of a switchable storage element 650D, increasing the overall reactance of the reactive element 640C. As shown in FIG. 6C, removal of one of the elements 682A-682C replaces the respective element 682A-682C with a short, removing the reactance from the reactive element 640C.

Figure 7:
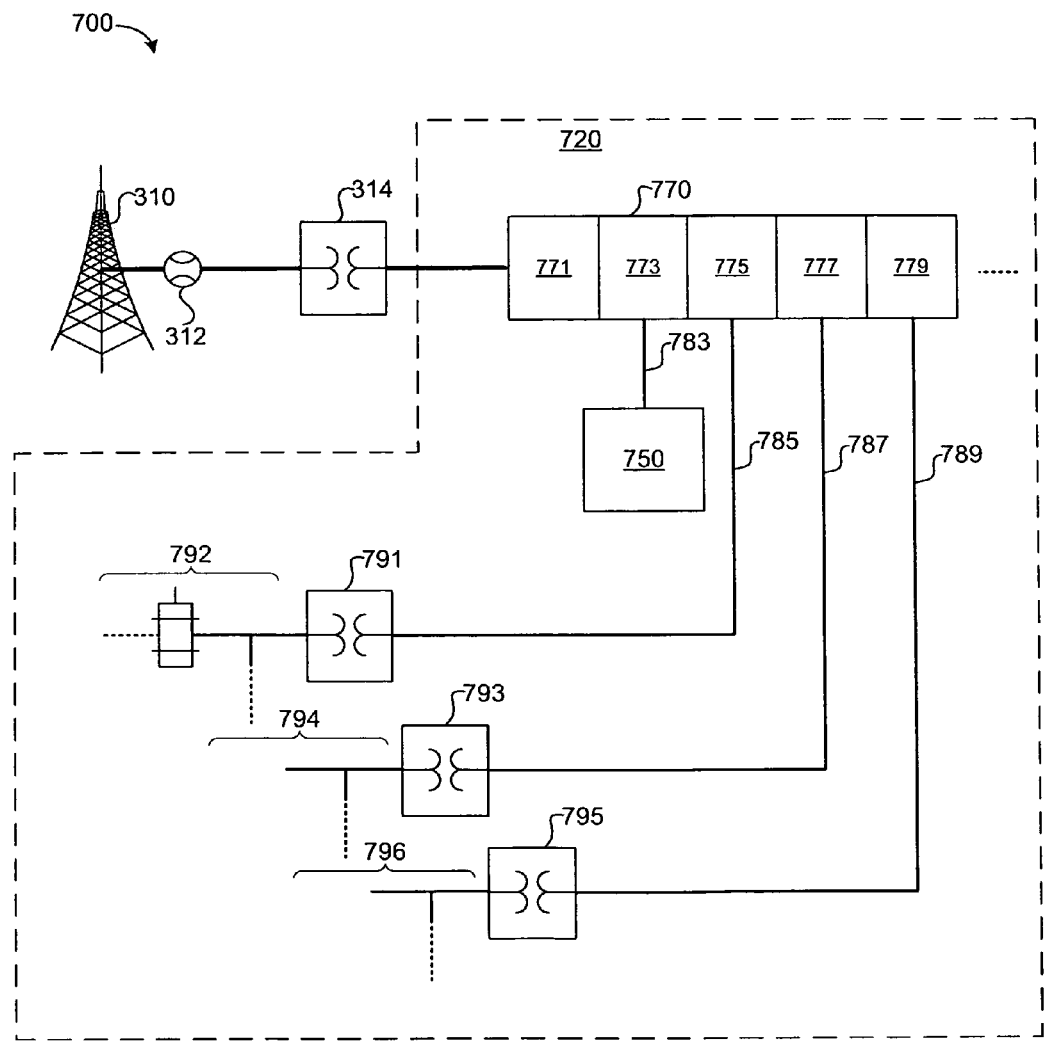
FIG. 7 is a block diagram of one embodiment of an electrical power system.

FIG. 7 is a block diagram of one embodiment of an electrical power system 700. The electrical power system 700 may be adapted to maximize the effect of a power conditioning and compensation module 750 disposed therein. As discussed previously herein, the power conditioning and compensation module 750 may comprise an energy storage element (not shown) and a reactive element (not shown), each of which may be configurable according to the power requirements of a particular entity 720.

The electrical power system 700 may receive electrical power from a power provider 310. The power supplied to the entity 720 may be metered by a power provider meter 312. The power from the power provider 310 may be delivered at a high voltage to reduce transmission power loss. As such, the power provider 310 may provide a transformer 314 to reduce the voltage level of the power delivered to the entity 720 to a level that is usable by the entity 720.

However, like the power provider 310, the entity 720 may elect to maintain the voltage of the incoming power at a relatively high voltage level. As discussed previously herein, this may be done to reduce losses due to high current conditions within the entity 720 (e.g., power may be transferred within the entity 720 at a high voltage level, which may reduce the current levels within the entity 720 to thereby reduce power losses due to impedance within the entity 720).

Accordingly, the transformer 314 provided by the power provider 310 may be configured to maintain the voltage level at an acceptable level, such as 480 volts or another common level. The electrical power may flow into a switch panel 770 of the entity. The switch panel may comprise a main disconnect 771 to allow the entity 720 to quickly disconnect itself from the power provider 310.

The power conditioning and compensation module 750 described herein may be electrically coupled to an output 773 of the switch. The power conditioning and compensation module 750 may be communicatively coupled to an electrical output 773 of the switch 770 to monitor the power flowing into the entity 720. In addition, in some embodiments, the power conditioning and compensation module 750 may be communicatively coupled to the main disconnect 771. This may allow the power conditioning and compensation module 750 to disconnect the entity 720 from the power provider 310 responsive to conditions within the entity 720, the power provider 310, responsive to user commands received via a communications network (not shown), or the like.

The switch 770 may comprise a plurality of outputs 775, 777, and 779, which may provide power to various electrical systems within the entity 720. The voltage level of the power transmitted from the switch 770 to the various outputs 775, 777, and 779 may be maintained at a relatively high voltage level to reduce the current flows within the entity 720, which, as discussed previously herein, may reduce power losses due to conductor resistance, heating, or the like.

The outputs 775, 777, and 779 may provide power to various electrical systems of the entity via respective conductors 785, 787, and 789. The conductors 785, 787, and 789 may comprise metallic, conductive wiring (e.g., copper wiring) or any other conductive material known in the art.

The voltage level of the electrical power provided to various electrical systems of the entity 720 may flow to one or more transformers to condition the power (e.g., set a voltage level of the electrical power) for use by the respective electrical systems 792, 794, and/or 796 of the entity 720. For example, a transformer 791 may be used to condition the electrical power delivered by the conductor 785 to the electrical system 792, a transformer 793 may be used to condition the electrical power delivered by conductor 787 to the electrical system 794, and a transformer 795 may be used to condition the electrical power delivered by conductor 789 to the electrical system 796. The respective electrical systems 792, 794, 796 may each comprise respective electrical components including, but not limited to motors, additional transformer elements, lighting elements, power outlets, and the like. As such, each of the electrical system 792, 794, and 796 may have different power requirements (e.g., draw different amounts of peak current, at different times of the day, and the like).

As discussed previously herein, by transmitting power from the switch 770 to the various electrical systems 792, 794, and/or 796 at higher voltage levels may reduce power loss due to high current levels on the conductors 785, 787, and 789.

However, despite maintaining a high voltage level, significant power loss may still occur on the conductors 785, 787, and/or 789 during current inrush conditions created by components within the respective electrical systems 792, 794, and/or 796 (e.g., at motor startup and the like). Such losses may be exacerbated if the conductors 785, 787, and/or 789 are excessively long—the longer the conductor 785, 787, and/or 789, the more power loss likely to occur. The losses may be measured as a voltage drop across the conductor 785, 787, or 789. In addition to the voltage drop, resistive qualities of the conductor 785, 787 or 789 may cause the current signal to lag the voltage signal, which may further degrade performance.

The power lost due to conductor inefficiencies, such as resistive conductance, excessive length, or the like, may degrade the performance of the power conditioning and compensation module 750. The degradation may occur since the power conditioning and/or power compensation (e.g., from the energy storage element (not shown) of the power conditioning and compensation module 750) must flow across the conductor 785, 787, or 789 to reach the device having the inrush current requirement. As such, and power loss occurring on the conductor 785, 787, or 789 will affect the compensation power delivered to the electrical system 792, 794, or 796 by the power conditioning and compensation module 750. As such, although the power conditioning and compensation module 750 may maintain the voltage level measured (by power provider meter 312) by the power provider 310, the power consumed by the entity 720 may increase and/or the quality of the power received by the various electrical systems 792, 794, and/or 796 within the entity 720 may be degraded.

Accordingly, the electrical power systems 700 may be laid out such that none of the conductors 785, 787, or 789 exceeds a maximum length. The maximum length of a particular conductor 785, 787, 789 may be calculated as a function of: the maximum current levels required by the particular electrical power system 792, 794, or 796 (e.g., during startup inrush conditions), the nature of the conductor (e.g., the gauge of the conductor, resistance of the conductor, resistance of connections on the conductor, or the like), the temperature within the entity 720, the magnitude of the voltage signal transmitted in the conductor, and the like. These factors may be used to calculate an estimated voltage drop and/or current lag factor across the conductor during peak current conditions. The estimated voltage drop and/or current lag may determine a maximum length the respective conductors 785, 787, 789, may have while maintaining acceptable performance levels within the entity 720.

The maximum length of the conductors 785, 787, and/or 789 may be used to arrange the electrical power systems 792, 794, and/or 796 within the entity 720. In some cases, the arrangement may minimize the length of the conductors connecting high-current applications to the switch 770. Alternatively, or in addition, the arraignment may comprise increasing a voltage level of the conductor (e.g., by utilizing a higher-voltage output transformer 314 or the like) to reduce the current levels on the conductor. Although not shown in FIG. 7, such embodiments may require multiple switches 770 and/or multiple power conditioning and compensation modules 750.

As discussed previously herein, the power conditioning and compensation module 750 may be communicatively coupled to one or more sensors disposed within the entity 720. Although not shown in FIG. 7, one or more of the sensors may be placed in proximity to the transformers 791, 793, and/or 795 and/or the electrical power systems 792, 794, and/or 796. This may allow the power conditioning and compensation module 750 to measure any voltage drop and/or current lag occurring on the respective conductors 785, 787, and/or 789. Responsive to detecting excessive voltage drop and/or current lag, the power conditioning and compensation module 750 may be configured to transmit a notification of the condition to one or more users (not shown) over a communications network (not shown). The notification may allow the users (not shown) to reconfigure the entity 720 (e.g., rearrange the switch 770, conductors 785, 787, and/or 789, or the like) to ameliorate the detected voltage drop and/or current lag.

Figure 8:
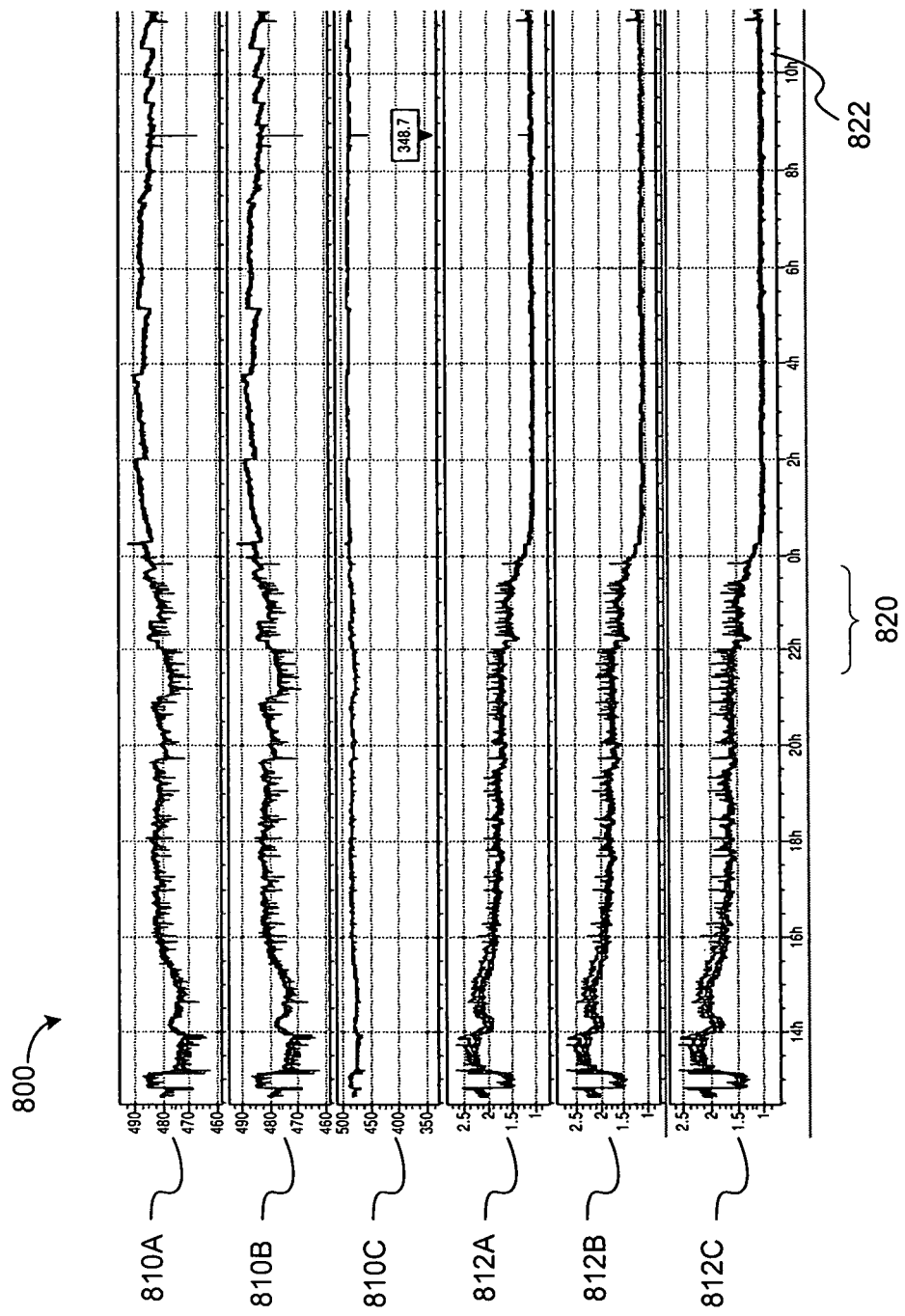
FIG. 8 is a plot of voltage and current measurements.

FIG. 8 shows results from a test of one embodiment of the system described herein. Plots 810A, 810B, and 810C show voltage measurements of each phase of a three-phase voltage signal over time. Plots 812A, 812B, and 812C show current measurements of each phase of a three-phase current signal over time. During the test, capacitive, energy stores (e.g., capacitors) distributed throughout the system were removed and consolidated at a location proximate to the power input of the system (e.g., the energy stores were distributed as shown in FIG. 3, and consolidated according to FIG. 4). At time 820, the transition was completed. As can be seen in the current plots 812A, 812B, and 812C, at the time 820, the current levels in the system were reduced, and the cross-talk harmonics created by the distributed capacitors were substantially eliminated.

The elimination of the noise on the current signals 812A, 812B, and 812C allowed for the startup transients of various components (e.g., motors) within the monitored facility to be observed. Several transient startup conditions are shown at time 822. Formerly, such transient startup conditions would have been masked by noise (e.g., harmonics and cross talk) created by the capacitive energy stores distributed throughout the system.

Figure 9:
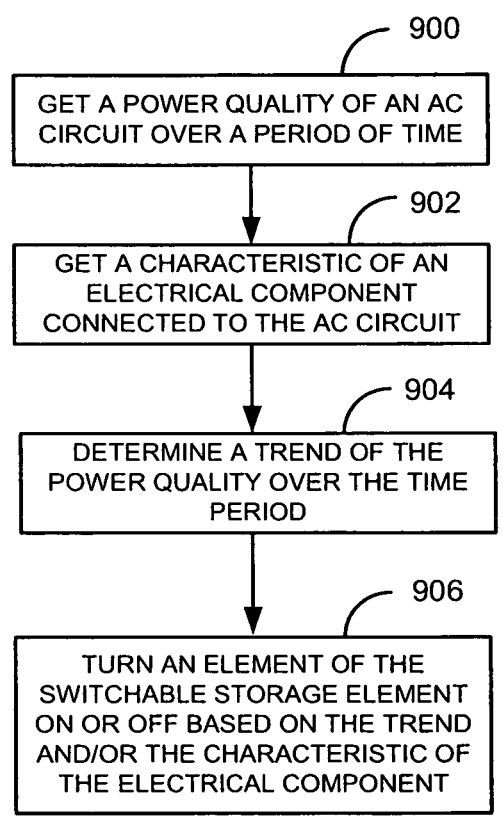
FIG. 9 is a flow diagram of a method for managing a power system.

FIG. 9 is a flow diagram of a method for managing a power system. The process begins when the control module 652 gets 900 a power quality of an AC circuit over a period of time. The control module 652 gets 902 a characteristic of an electrical component 635 connected to the AC circuit. The control module 652 determines 904 a trend of the power quality over the time period. The control module 652 turns an element (630 and/or 640) of the switchable storage element 650 on or off based on the trend and/or based on the characteristic of the electrical component 635.

After being apprised of the instant disclosure, one of ordinary skill in the art would be able to readily make and use the invention using commercially available materials, components, and parts.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product, including a computer-readable medium having stored instructions thereon that may be used to program a computer (or other electronic device) to perform processes described herein. The computer-readable medium may include, but is not limited to: hard drives, floppy diskettes, optical disks, CD-ROMs, DVD-ROMs, ROMs, RAMS, EPROMs, EEPROMs, magnetic or optical cards, solid-state memory devices, or other types of media/machine-readable medium suitable for storing electronic instructions.

As used herein, a software module or component may include any type of computer instruction or computer executable code located within a memory device and/or transmitted as electronic signals over a system bus or wired or wireless network. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention. In the claims, singular terms such as a and an, are intended to include one or more of the terms.

What is claimed is:

1. A method for managing a power system, the method comprising:

receiving a power quality of an Alternating Current (AC) circuit of the power system over a time period with a meter;
determining a trend of the power quality over the time period;
storing electricity of the AC circuit in a switchable storage element having an energy storage capacity; and
dynamically changing the energy storage capacity of the switchable storage element to improve a power factor of the AC circuit based upon the trend of the power quality by turning an element of the switchable storage element of the power system on or off while maintaining power transfer from a power source to the AC circuit.

2. The method of claim 1, further comprising receiving a characteristic of an electrical component connected to the AC circuit and turning the element of the switchable storage element on or off based upon the characteristic of the electrical component.

3. The method of claim 1, wherein the AC circuit comprises a plurality of AC circuits, wherein the trend is determined based on a power quality of the plurality of AC circuits over the time period, and further comprising receiving the power quality of the plurality of AC circuits over the time period.

4. The method of claim 3, further comprising receiving a characteristic of an electrical component connected to the AC circuit and turning the element of the switchable storage element on or off based upon the characteristic of the electrical component.

5. The method of claim 1, further comprising turning the element of the switchable storage element on or off prior to an event initiated by components on the AC circuit.

6. The method of claim 5, wherein the event is a predetermined event selected from the group comprising: a changing of a shift, a holiday, a calendar event, a specific time, a maintenance period, a plant closing, and a recurring event.

7. The method of claim 1, further comprising receiving a characteristic of the switchable storage element and turning the element of the switchable storage element on or off based on the characteristic, wherein the characteristic is selected from the group consisting of power quality, temperature, power status, light, smoke, water, vibration, nearby movement, machine speed, pressure of a component of the machine, fluid level of the machine, torque of the machine, and combinations of any thereof.

8. The method of claim 1, wherein the power quality is an item selected from the group comprising at least one of the following: a harmonic, a power factor, a phase, a current, a voltage, an impedance, a reactance, an active power, an apparent power, a peak power, a reactive power, phase load, a phase load balance, and a phase balance.

9. The method of claim 1, wherein the trend is a change in at least one of the following: a harmonic, a power factor, a phase, a current, a voltage, an impedance, a reactance, an active power, an apparent power, a peak power, a reactive power, phase load, a phase load balance, and a phase balance.

10. The method of claim 1, wherein turning an element of a switchable storage element of the power system on or off includes adding additional or subtracting capacitance to the storage element based on the trend.

11. The method of claim 1, further comprising correlating the power quality to operation of a particular component of the AC circuit.

12. The method of claim 1, wherein turning an element of a switchable storage element of the power system on or off includes adding additional or subtracting reactance to the switchable storage element based on the trend.

13. A system for managing a power system, the system comprising:
- a switchable storage element having an energy storage capacity and configured to store electricity of an alternating current (AC) circuit of a power system;
- a meter operably coupled with the AC circuit and configured to measure a power quality of the AC circuit over a time period; and
- a control module operably coupled with the switchable storage element and the meter, the control module configured to receive the power quality of the AC circuit over a time period, and dynamically change the energy storage capacity of the switchable storage element to improve a power factor of the AC circuit based on the trend of the power quality by turning an element of the switchable storage element on or off while maintaining power transfer from a power source to the AC circuit.

14. The system of claim 13, wherein the control module is further configured to receive a characteristic of an electrical component connected to the AC circuit and turn the element of the switchable storage element on or off based on the characteristic of the electrical component.

15. The system of claim 13, wherein the AC circuit further comprises a plurality of AC circuits, wherein the control module is further configured to receive a power quality of the plurality of AC circuits over the time period through a commonly metered connection, and wherein the trend is determined based on the power quality of the plurality of AC circuits over the time period.

16. The system of claim 15, wherein the control module is further configured to receive a characteristic of an electrical component and turn the element of the switchable storage element on or off based on the characteristic of the electrical component.

17. The system of claim 13, wherein the control module is further configured to notify a user of the trend or is recorded or processed on a system, server, or other computers as a target for trend information.

18. The system of claim 13, wherein the control module is further configured to receive a command from a user in a network.

19. The system of claim 13, wherein the control module is connected to a network and wherein the control module can turn the element of the switchable storage element on or off prior to an event initiated by components on the AC circuit.

20. The system of claim 19, wherein the event is an event determined by a distinguishable power usage pattern for one or more components of the AC circuit that is determined based on the trend.

21. The system of claim 20, wherein the distinguishable power usage pattern includes an inrush of current to the one or more components of the AC circuit.

22. The system of claim 13, wherein the control module is further configured to receive a characteristic of the switchable storage element and turn the element of the switchable storage element on or off based upon the characteristic, wherein the characteristic is selected from the group consisting of power quality; temperature, power status, light, smoke, water, vibration, nearby movement, machine speed, pressure of a component of the machine, fluid level of the machine, torque of the machine, and combinations of any thereof.

23. The system of claim 22, wherein the switchable storage element comprises a plurality of switchable storage elements, wherein the characteristic of the switchable storage element is a temperature, and wherein the control module turns at least one of the plurality of switchable storage elements on or off based upon the temperature.

* * * * *